United States Patent [19]

Bohlen et al.

[11] 4,370,554

[45] Jan. 25, 1983

[54] ALIGNMENT SYSTEM FOR PARTICLE BEAM LITHOGRAPHY

[75] Inventors: Harald Bohlen, Boeblingen; Johann Greschner, Pliezhausen; Werner Kulcke, Boeblingen; Peter Nehmiz, Stuttgart, all of Fed. Rep. of Germany

[73] Assignee: International Business Machines Corporation, Armonk, N.Y.

[21] Appl. No.: 183,118

[22] Filed: Sep. 2, 1980

[30] Foreign Application Priority Data

Sep. 27, 1979 [DE] Fed. Rep. of Germany ....... 2939044
Jun. 26, 1980 [EP] European Pat. Off. ........... 80103603

[51] Int. Cl.³ ............................................ G01N 23/00
[52] U.S. Cl. ................................ 250/491.1; 250/397; 250/492.2
[58] Field of Search ................... 250/491, 492.1, 492.3, 250/492.2, 398, 397; 219/121 EX, 121 EW, 121 EY, 121 EU, 121 EV

[56] References Cited

U.S. PATENT DOCUMENTS

| | | | |
|---|---|---|---|
| 3,875,416 | 4/1975 | Spicer | 250/492.2 |
| 3,876,883 | 4/1975 | Broers et al. | 250/492.2 |
| 4,130,761 | 12/1978 | Matsuda | 250/492.2 |
| 4,169,230 | 9/1979 | Bohlen et al. | 250/492.2 |

FOREIGN PATENT DOCUMENTS 2719800 11/1978 Fed. Rep. of Germany.
2046332 1/1979 Fed. Rep. of Germany.

OTHER PUBLICATIONS

Livesay, "Computer Controlled Electron-Beam Projection Mask Aligner", Solid State Technology, 17 (7), Jul. 1974, pp. 21-26.

Primary Examiner—Alfred E. Smith
Assistant Examiner—Carolyn E. Fields
Attorney, Agent, or Firm—Joseph C. Redmond, Jr.

[57] ABSTRACT

The mutual alignment of mask and substrate patterns of a specific semiconductor structure are attained by use of a plurality of individual marks in a specific geometric position with respect to each other. By the arrangement of openings in the alignment pattern of the mask, the broad electron beam is split into a multitude of individual beams which interact with alignment marks on the substrate. The interaction is used to generate a coincidence signal. The signal to noise ratio of this arrangement is determined by the overall current and is comparable to that of a thin concentrated electron beam. Registration is effected in a small amount of time and the disadvantageous effects of the high current density used in the raster process are not a factor. In a preferred embodiment, the alignment pattern of the mask is a matrix with center spacings of openings increasing upon advance in two directions perpendicular to each other such that no distance can be represented by the sum of smaller distances. Alignment signals are provided by detecting either absorbed or reflected electrons. A plurality of detectors in the mask are used to detect the reflected electrons.

18 Claims, 13 Drawing Figures

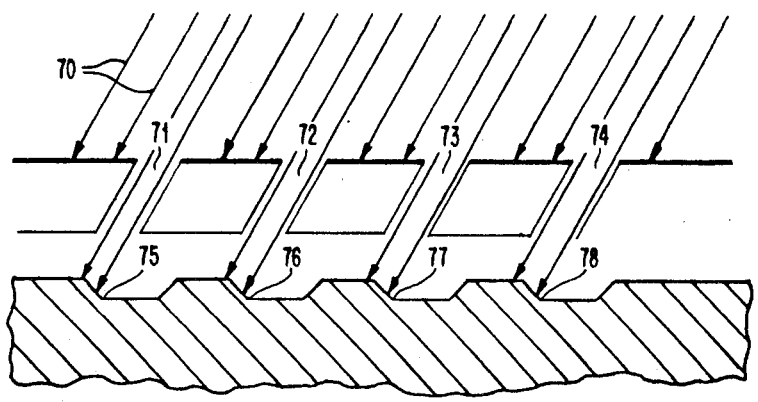
FIG. 7
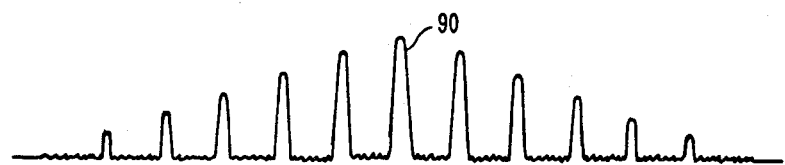
FIG. 8
FIG. 9

FIG. IIA
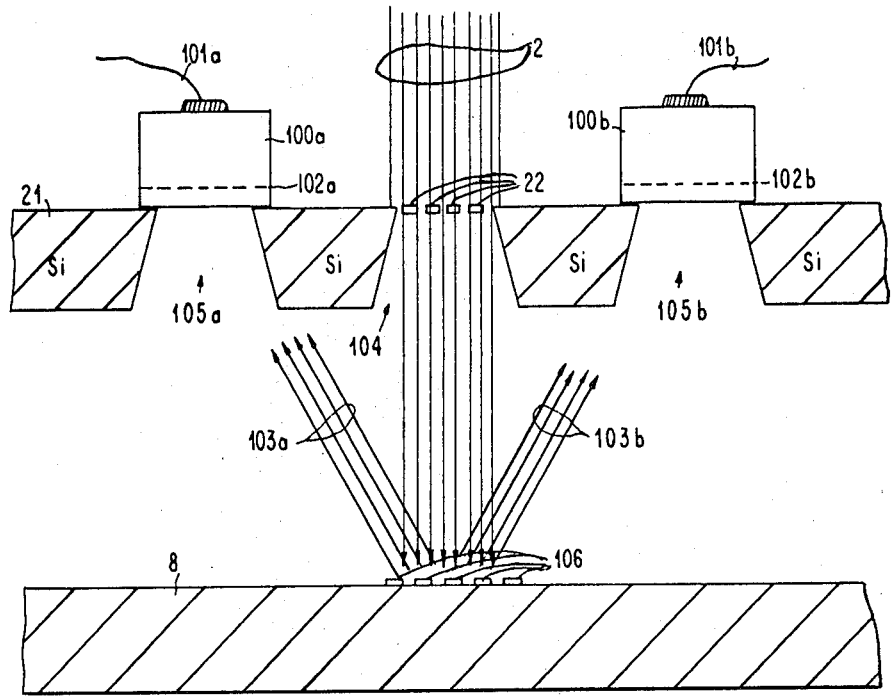
FIG. IIB
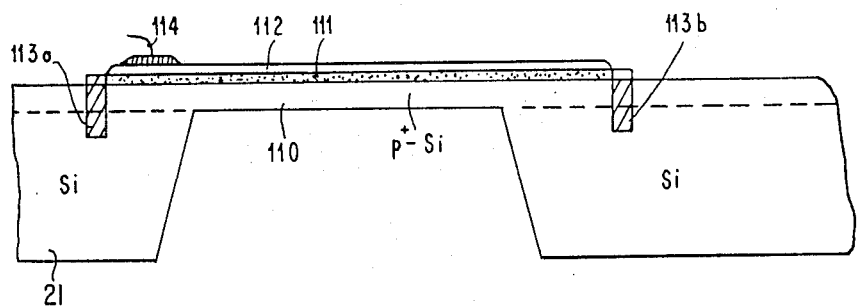

ALIGNMENT SYSTEM FOR PARTICLE BEAM LITHOGRAPHY

BACKGROUND OF THE INVENTION

The invention relates generally to a particle beam projection system for exposing a substrate through a mask. More particularly, the present invention relates to an alignment system for a particle beam projection system which is adapted for rapid and accurate registration of a mask and a substrate prior to exposure of the substrate to a beam of particles.

The tendency of integrated circuits in semiconductor technology is toward ever-decreasing structure dimensions in order to increase the density of the circuits and their switching speed. Photolithography, which is still used today in the majority of cases, is approaching the limits dictated by the physical resolution of optical systems. Structures having conductive lines in the submicron range of less than $1\mu$ cannot be made with optical systems. The most promising methods for the production of such fine structures are particle beam processes. The following specification refers specifically to electron beam systems but the projection system described herein can also be applied analogously to other particle beam projection systems, such as ion beam.

For this kind of use, electron beam systems have a number of advantages: the resolution of the patterns made with them is not limited by diffraction effects; they can be made with high intensity and they are deflectable with relative ease and high precision.

The most progressive developments in this field operate in accordance with the raster or scanning principle. The electron beam is used as a very fine "pencil" with which the pattern to be exposed is directly written onto a semiconductor substrate coated with an electron beam sensitive layer. The pattern to be produced is provided in the storage of a computer controlling the deflection of the electron beam. The high flexibility of this type of pattern generation, however, involves a high amount of writing time. The throughput of exposed wafers in industrial production is therefore low.

In the production of circuits and circuit chips (chips) having a plurality of repeatedly appearing circuit elements, e.g. memory chips, the flexibility of the raster method is of secondary importance. On the other hand, costs can only be reduced by high chip throughput. Electron beam projection methods utilizing a mask and operating analogously to optical photolithographic methods offer this high throughput since their larger pattern areas are imaged on the substrate by means of the mask through electron radiation. Such systems are known as described in the publications by H. Koops et al., Optik 28, 5, 1968/1969, pp. 518-531; T. W. O'-Keeffe, *Solid State Electronics*, Pergamon Press, 1969, Vol. 12, pp. 841-848; M. B. Heritage, "Electron Projection Micro Fabrication System", *Journal of Vacuum Science Technology*, Vol. 12, 1975, pp. 1135-1138 and U.S. Pat. No. 4,169,230 and copending U.S. patent application Ser. No. 70,453 filed Aug. 28, 1979, now U.S. Pat. No. 4,334,156 both assigned to the assignee of the present application.

The problem of increased production of highly integrated monolithic circuits, however, involves not only the possible resolution through the exposure method used but also the precision of the mutual alignment of mask and semiconductor substrate in each exposure step required during a manufacturing process. For achieving good overlapping (so-called "overlay"), registration has to be very precise and therefore requires a considerable amount of time. Registration is the detection of structures existing on the wafer prior to exposure, and the alignment of the pattern to be imaged (mask) relative to the existing structure.

Patterns for alignment (alignment marks) in electron beam processes are either markings of a material differing from that of the semiconductor substrate, and/or areas of a particular geometric design, e.g. edges. The impinging electron beam releases in these areas secondary electrons whose reflected or substrate-absorbed part can be measured and utilized as a signal.

For achieving a high signal to noise ratio the electron beam impinging at the alignment marks should have a high current density (see W. Stickel, "Method of optimizing registration signal for electron beam microfabrication" in *Journal of Vacuum Science and Technology*, Vol. 15, No. 3, May/June 78, pp. 901-905). This alignment method operates satisfactorily for raster processes. In mask exposure, however, the projection methods operate with an expanded electron beam of a relatively low current density. The secondary electrons released by this beam at the conventional alignment marks provide very low registration signals with a high noise factor. Prior art mask methods therefore had to adopt specific measures, which will be described below, to ensure satisfactory registration in spite of these obstacles.

One possible improvement consists in the multiple deflection of the beam over the mark with subsequent electronic integration for improving the signal to noise ratio, but this process is time-consuming.

Another suggestion involves switching the electron beam from one exposure mode (with low current density) to a registration mode with high current density (see the article by Heritage). However, the switching of the beam path is difficult to accomplish since the two beam paths cannot always be reproduced.

According to another suggestion (8th International Conference on Electron and Ion Beam Science and Technology, May 1978, page 984, Frosien et al.), switching is abandoned and mechanical diaphragms are pivoted into the beam path instead. This avoids the switching between the two modes of operation but the problems with the still insufficient current density remain. Furthermore, such mechanical adjustments are not realizable within very short periods.

Other important parameters in electron beam-lithographic methods include the method by which registration signals are detected and the geometric relations. The evaluation of the electrons reflected at alignment marks cannot always be used in shadow printing methods with electron beams since the distance between the mask and the semiconductor wafer is small (typically 0.5 mm) so that detector devices for electrons cannot be easily inserted. This differs from systems where there are electron-optical imaging means between the mask and the semiconductor wafer.

For automatic as well as manual registration, a method for quickly reaching a registered position should be provided. For this purpose the relative position of the objects at any moment and the direction and shift of the objects to reach the registered position must be known. In German Auslegeschrift 20 46 332, an alignment pattern is described for a photoelectric device, where the spacings between two respective mask openings are not constant. The spacing of the openings corresponds to an arithmetic series. For two-dimensional alignment, two rows of such mask openings arranged vertically to each other are provided. This arrangement has the disadvantage of a low transparency (ratio between the surface of the openings to the overall surface) so that if subjected to electron beam exposure systems the signal to noise ratio would be low. This arrangement also requires two detectors.

It is therefore the object of the present invention to provide a particle beam projection system which operates with mask projection and which permits a quick, precise and automatic registration. This object is achieved by the invention characterized in the main claim; embodiments of the invention are characterized in the subclaims.

SUMMARY OF THE INVENTION

In general, the mutual alignment of mask and substrate patterns of a specific semiconductor structure are attained by use of a plurality of individual marks in a specific geometric position with respect to each other. By the arrangement of openings in the alignment pattern of the mask, the broad electron beam is split into a multitude of individual beams which interact with alignment marks on the substrate. The interaction is used to generate a coincidence signal. The signal to noise ratio of this arrangement is determined by the overall current and is comparable to that of a thin concentrated electron beam. Registration is effected in a small amount of time and the disadvantageous effects of the high current density used in the raster process are not a factor.

The use of a multitude of partial beams for registration averages out possible edge imprecision of the individual registration marks on the wafer.

Through the specific geometric arrangment of the individual alignment marks it is possible to detect the direction of a deviation from a registered position. The registration process can therefore be accelerated and made automatic.

Two different methods can be followed to receive the registration signal: either the current which is generated in the substrate by the electrons absorbed there is measured; or the electron current that is reflected at the alignment marks is measured. For measuring the reflected current, specific integrated detector devices for electrons are described. Due to small time constants (RC elements), the evaluation of the reflected electrons can be effected more quickly than the evaluation of absorbed electrons but the signal to noise ratio of reflected electrons is poorer.

The registration patterns of the invention can be used with particular advantage in a two-stage registration process. By means of a first set of registration patterns, the entire semiconductor disk (wafer) is aligned mechanically relative to the mask. Additionally, each chip area on the wafer (i.e. each area with 5–10 mm edges in which circuits are to be defined) has another pair of registration patterns associated therewith. This pair of patterns is used for the fine adjustment (chip registration) through electronic beam tilting. The fine adjustment required several hundred times for each wafer can therefore be performed very quickly and consequently contributes to the high throughput of the projection exposure method using the specific registration patterns of the invention.

DESCRIPTION OF THE DRAWINGS

FIG. 7 is an illustration of the splitting and tilting of the electron beam in registration, FIG. 8 is an alignment mask for detecting search direction, FIG. 9 is a registration signal generated in connection with the use of the mask in FIG. 8, FIG. 11A is an electron detector integrated in the exposure mask.

FIG. 11B is a further embodiment of an electron detector.

DETAILED DESCRIPTION OF THE INVENTION

Figure 1:
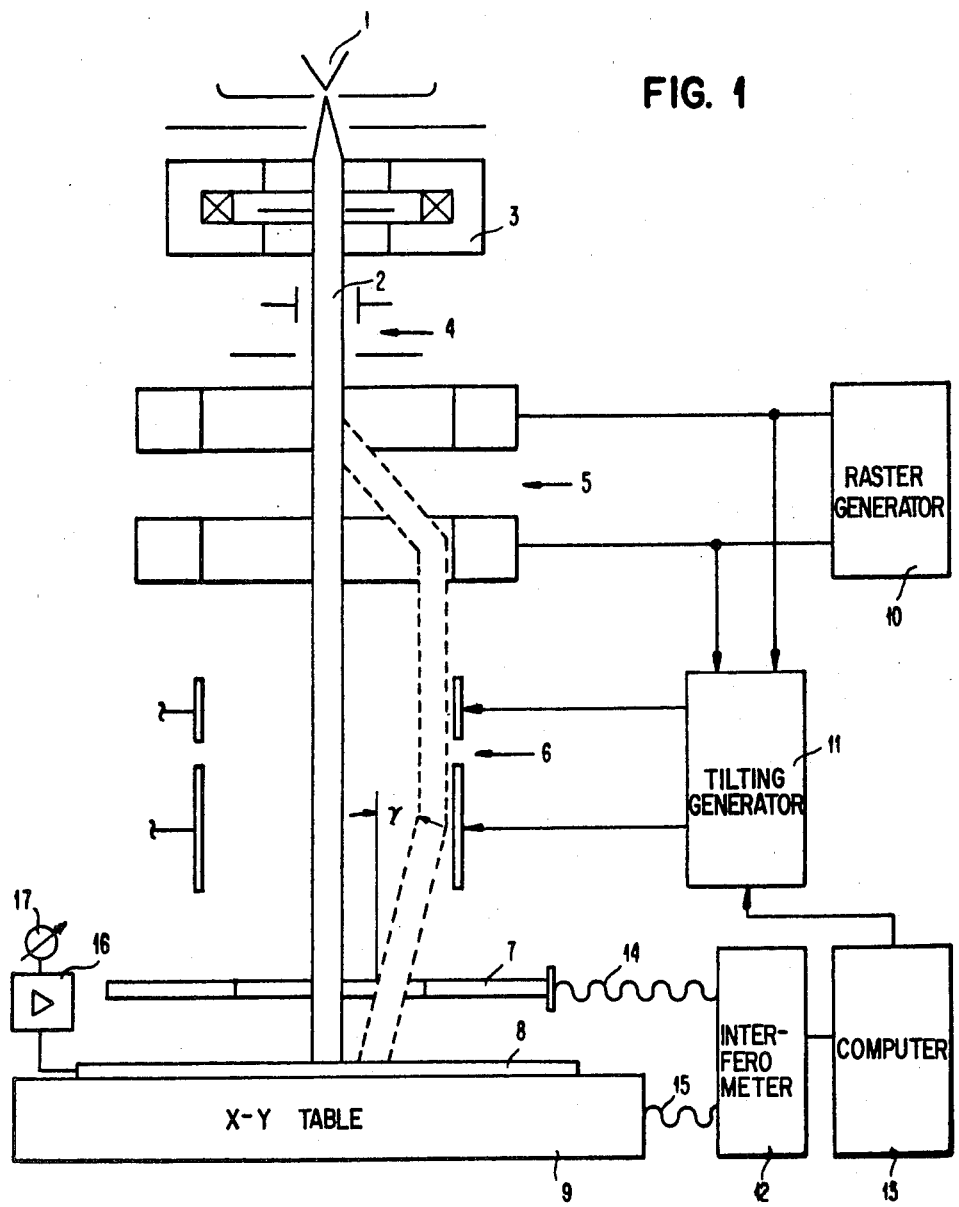
FIG. 1 is a schematic diagram of an electron beam projection system.

In FIG. 1 an electron beam source 1 generates an electron beam 2 which can be focused with a collimator lens 3 and blanked with a device 4. An electromagnetic deflector 5 permits the controllable parallel shifting of the electron beam and an electrostatic or electromagnetic deflector 6 permits the tilting of the electron beam about a point in, or near, mask 7. An X/Y-table 9 supports a semiconductor wafer (wafer) 8 to be exposed. A raster generator 10 to control beam deflection, a tilting generator 11 to control tilting of the beam, and an interferometric arrangement 12 comprising interferometric measuring paths 14 and 15 are coupled to a computer 13 to complete the arrangement. The interferometric adjustment of mask 7 and wafer 8 is described in detail in Patent 4,334,156 mentioned before.

After wafer registration, the individual chip areas are successively brought into exposure position through the interferometrically controlled shifting of the wafer. In the interferometric shifting (which is per se very precise) the chip areas reach exposure position with a tolerance of approximately $2\mu$, e.g. due to distortions of the wafer caused by preceding hot process steps.

In FIG. 1 there are no further electron-optical imaging means between mask 7 and wafer 8. In such shadow printing exposure (proximity printing), imaging is effected in a scale of 1:1.

In this arrangement, mask 7 is at a relatively small distance from wafer 8 (typically 0.5 mm). The prior art measuring of secondary electrons scattered back at alignment marks by means of detectors arranged over the wafer is difficult to carry out for space reasons. Electron detectors which can measure the electrons reflected at the alignment marks under the geometric conditions of the invention are described below with reference to FIGS. 10A, 10B, 11A and 11B.

Instead of the electrons reflected at alignment marks, it is also possible to use the electrons absorbed in the substrate for registration. These two types of signals and their alterations with respect to time are equivalent to each other.

The embodiment discussed below refers to the evaluation of absorbed electrons. For that purpose, an amplifier 16 with associated display device 17 is connected to wafer 8.

Apart from the compact structure, the advantage of this measuring method is that it always responds to all absorbed electrons of the registration beam, contrary to measuring with secondary electrons which contribute only if emitted into the solid angle defined by the detector. In photoresist-coated substrates, the absorbed current is always higher than the reflected current since the latter is attenuated by the photoresist. The signal-to-noise ratio of the absorbed electrons is furthermore better than with reflected electrons. A disadvantage of the evaluation of the absorbed electrons lies in the higher time constant of the respective circuits which is determined in particular by the relatively high capacity of the substrate. This time constant (RC elements) furthermore depends on the size of the substrate.

In accordance with the invention, a two-stage method is used for registration: mechano-interferometric wafer registration and stepwise shifting for coarse registration followed by precision alignment using electron beam registration. It is thus possible to compensate those inaccuracies which appear even in ideal wafer registration, e.g. the local wafer warpage (so-called continental drift of individual wafer areas) caused through the thermic wafer stress generated by various hot temperature steps of the manufacturing process. These irregularities on the wafer are compensated for by the apparatus and method of the invention by subjecting each individual chip area to an individual fine adjustment prior to exposure. As fine adjustment is effected purely electronically, the time required is very short (approximately 100 ms).

Figure 2:
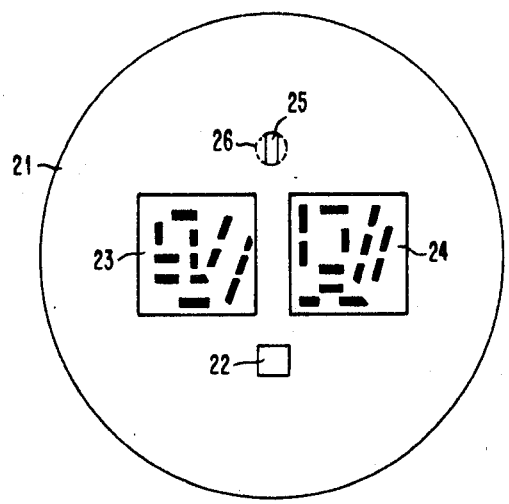
FIG. 2 is an exposure mask with registration patterns.

The arrangement of registration aperture grids and exposure aperture grids in the shadow printing mask is shown in FIG. 2 for one single chip area. As shown in FIG. 2, mask disk 21 contains a registration aperture grid 22 for registering the wafer, pairs of chip aperture grids 23, 24 (described in more detail in applicants' above mentioned U.S. Pat. No. 4,169,230) and for each pair of chip aperture grids, a chip registration aperture grid 25 for chip registration. Dashed circle 26 of FIG. 2 corresponds to the diameter of the electron beam used for exposure; it is approximately 1 mm.

On the wafer surface (outside the zones where circuits are to be defined) registration marks are provided whose structure corresponds to the apertures of the registration grids. These marks can be designed as edges (corresponding to the representation of FIG. 7 at reference numbers 75–78), or they can consist of corresponding metal patterns.

Chip registration grid 25 is oriented in a position such that upon registration the electron beam does not encroach on the chip area. As the spacing between the two chip aperture grids 23, 24 is about 0.2 mm the registration grid 25 cannot be arranged in this space. The width of registration grid 25 is preferably slightly smaller than the spacing between the chip aperture grids; its length corresponds to the diameter of the electron beam.

Registration grid 22 for wafer registration corresponds in its size ($\sim 1 \times 1$ mm) approximately to the beam diameter.

After the fine adjustment effected separately for each chip area through use of registration grid 25, the electron beam scans raster-fashion over the chip aperture grids to illuminate them homogeneously. The angle of tilt of the beam during exposure corresponds to that established during fine adjustment.

Since the relative position of the exposure and registration grids after registration is constant, the diameter of the electron beam does not have to be changed at any moment.

Figure 3:
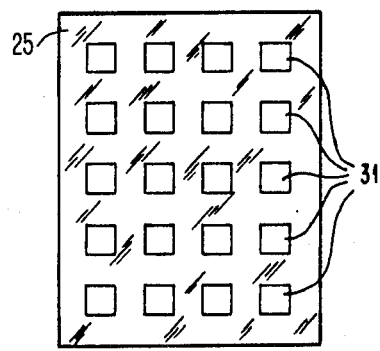
FIG. 3 is an alignment mask with multiple apertures for increasing the signal to noise ratio.

Registration grids 22 and 25 of FIG. 2 each have a multitude of openings in two directions that are oriented perpendicular to each other. A simple arrangement of the apertures 31 of a chip registration grid 25 is represented in FIG. 3 with equal spacings between the individual openings. Here as well as in the following examples the wafer also has a registration mark structure which is substantially like the hole pattern of the respective registration grid. The dimensions of the registration marks on the wafer, however, are generally slightly greater than those of the partial beams formed by the aperture grid upon the passing of the electron beam, so as to obtain an optimum registration signal. The registration marks on the wafer corresponding to the aperture grid are preferably placed onto the kerfs along which the wafer is cut into individual chips. For registration, the wafer is shifted relative to the registration grid until the mark pattern of the wafer is placed optimally beneath the hole pattern of the grid. Registration is indicated by a maximum registration signal generated by the number of absorbed electrons.

In the simple square matrix of FIG. 3 there is no uniqueness between registration signal and relative position owing to the symmetry of the pattern. A unique personalized registration signal can be obtained from asymmetrical hole patterns, such as that shown in FIG. 4. The individual holes 41 of grid 25 and the corresponding marks on the wafer, respectively, are arranged at irregular distances. The rule (equation 2) governing the uniqueness of registration provided by different hole patterns is derived below.

The center spacings $d\mu$ (FIG. 4) of any two holes in one row and/or column all differ from each other and can be represented as the integer multiple of a quantity do which is greater than the width of a registration mark lo:

$$do = lo + \epsilon \tag{1}$$

The amount of $\epsilon (\geq 0)$ depends on whether the registration signal is generated mostly through the scattering of electrons at the edge of the registration mark which consists of the same material as the substrate (relief contrast), or through increased reflection at a specific mark material (material contrast). In the latter case, $\epsilon$ can be approximately 0.

The center spacings of any two holes are obtained from:

$$d\mu = n\mu \cdot do \text{ with } n\mu = \epsilon\{2, 3, 4, \ldots\} \tag{2}$$

with the following restriction:

Of the set of possible hole distances $d\mu$ only those are accepted which cannot be represented as the sum of other distances.

Figure 4:
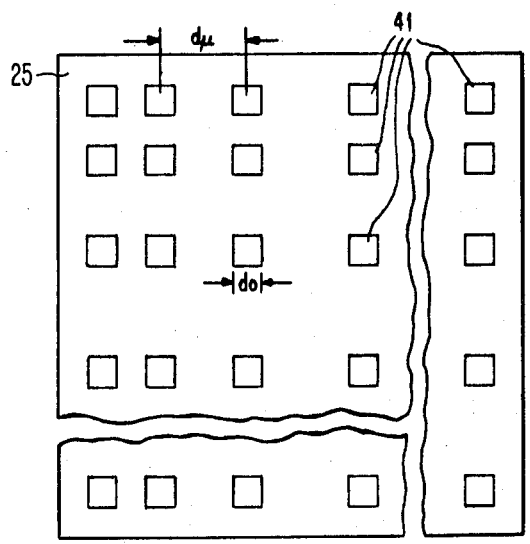
FIG. 4 is an alignment mask with multiple apertures and differention of registration in the x- and y-direction.

According to this condition many spacing arrangements are possible. Examples for do=1 in arbitrary units are:

2, 3, 4, 8, 16 (see FIG. 4 with $\epsilon=0$)

or 2, 4, 5, 8, 16 or 2, 3, 6, 7, 14 etc.

as well as their mirror arrangements.

In all these arrangements, the maximum signal indicating the coincidence of grid holes and wafer marks is higher than the basic signal by a factor of K when the corresponding grid opening and wafer mark are exactly one over the other. K is equal to number of openings.

The total registration current reached with the registration aperture grid of FIG. 4 can be assessed as follows:

| | |
|---|---|
| registration mask surface: | $S_R = 0.2 \cdot 1$ mm$^2$ |
| cross-section of the electron beam: | $S_{EB} = \pi(\frac{1}{2})^2$ mm$^2$ |
| transparency of the mask section (surface of holes/overall surface): | $T = 0.13$ |
| beam current in cross-section $F_{EB}$: | $i_{EB} = 60 \mu A$ |
| registration current: | $i_R = T \frac{F_R}{F_{EB}} \cdot i_{EB} = 2.0 \mu A$ |

This current corresponds approximately to that of the raster process although the current density of the electron beam is very much lower. In both cases, the signal to noise ratio of the registration signals is comparable since it is substantially determined by the overall current: the noise percentage of primary current and reflected current increases only proportionally to the root of the overall current. Owing to the high signal to noise ratio short registration times are possible.

Figure 5:
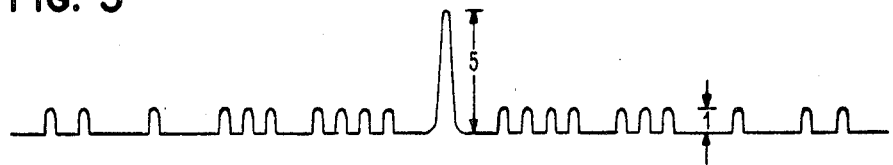
FIG. 5 is a registration signal generated in connection with the use of the mask shown in FIG. 4.

A registration mask structured in accordance with the above conditions permits a decision on the direction in which the wafer is to be moved for reaching the registration position. FIG. 5 shows the sequence of signals generated during mask shifting. As long as registration has not been attained, signals are obtained in a sequence characteristic for the respective mask and are symmetrical relative to the maximum signal for the registered position. In the mask of FIG. 4, with K=5 openings per row and column, the registration signal is 5 times higher than the basic signal. The hole sequences in x- and y-direction in two-dimensional registration can also be different and supply correspondingly different signal sequences.

Figure 6:
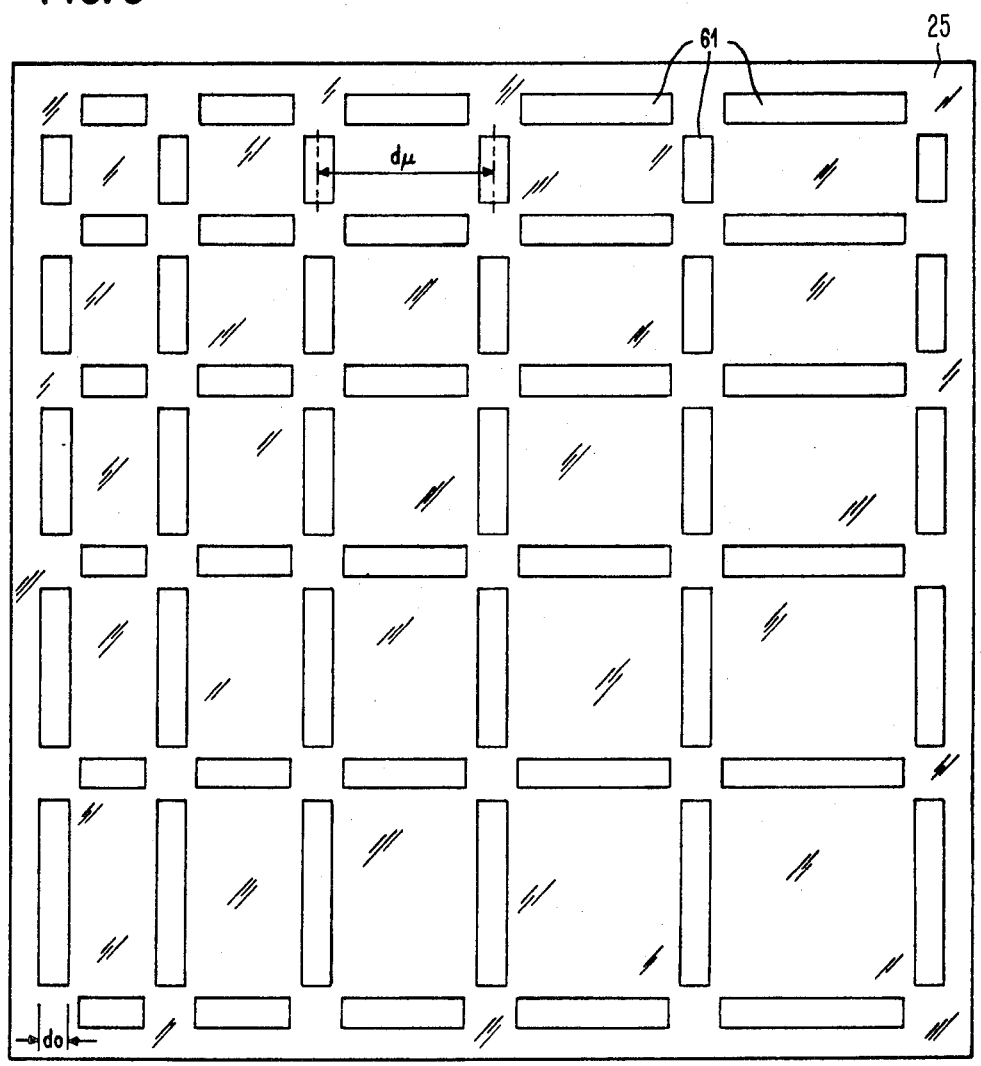
FIG. 6 is a further embodiment of the mask of FIG. 4.

The mask shown in FIG. 4 with square openings and a relatively low transparency of T=0.13 has the disadvantage that with a highly misaligned initial position there is only a very poor coincidence between grid openings and registration marks. The registration signal is then very low and in unfavorable cases does not suffice for effecting registration. With a grid structure according to FIG. 6 this disadvantage is excluded. Instead of the square openings, rectangular openings (61) are used whose spacings are selected in accordance with the same conditions as in FIG. 4. The grid openings thus include in x- and y-direction rectangles of growing surface. The transparency of the grid is thus increased to the value T=0.2 and it is ensured that even if the grid and the wafer are considerably shifted relative to each other there is a sufficiently high registration signal. The signal sequence in registration substantially corresponds to that of FIG. 5. Here, maximum registration current is 3 $\mu A$ (instead of 2 $\mu A$ as in FIG. 4). The spacing sequence in the example selected is 4, 5, 6, 7, 8.

The registration grid structures discussed above in accordance with FIG. 4 or 6 are particularly suited for registration by electronic beam tilting through the individual chip aperture grids with stationary wafer. FIG. 7 shows this process by means of a cut vertical to the wafer surface; beam 70 is split by the registration grid into partial beams 71, 72, 73, 74 and is tilted until the registration signal generated at registrations marks (edges) 75, 76, 77, 78 etched into the wafer shows a maximum value. With the thus determined beam tilting the electron beam is subsequently guided over the exposure masks for the respective chip, row by row in such a manner that a homogenous illumination is achieved. As mentioned above, the usual registration area of this method is several $\mu$.

If at the beginning there are any remarkable differences between mask and wafer, particularly in the mechano-interferometric wafer registration (with an adjustment area of approximately 0.5 mm), a mask with the structure shown in FIG. 8 is used. It consists of a plurality of registration grids M each structured as in FIG. 4 or 6. This multiple grid generates a registration signal as shown in FIG. 9. Signal 90 corresponding to the registered position has the maximum value, the amplitudes of the secondary signals increase when approaching the registered position. It is therefore easier to determine the direction of movement leading to the registered position than with single aperture grids of the above discussed type.

If the reflected rather than the absorbed electrons are to be used to reduce the registration time this can be effected with detector arrangements shown in FIGS. 10 and 11. These arrangements are semiconductor detectors (with pn-junctions) arranged round the registration grid as part of the exposure mask.

Figure 10A:
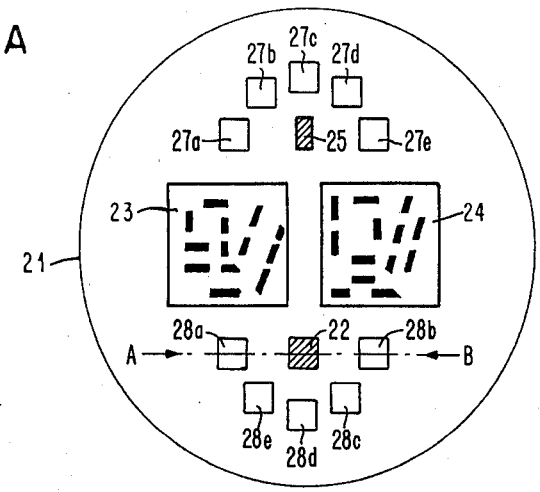
FIG. 10A is an exposure mask with an integrated arrangement of electron detectors.
Figure 10B:
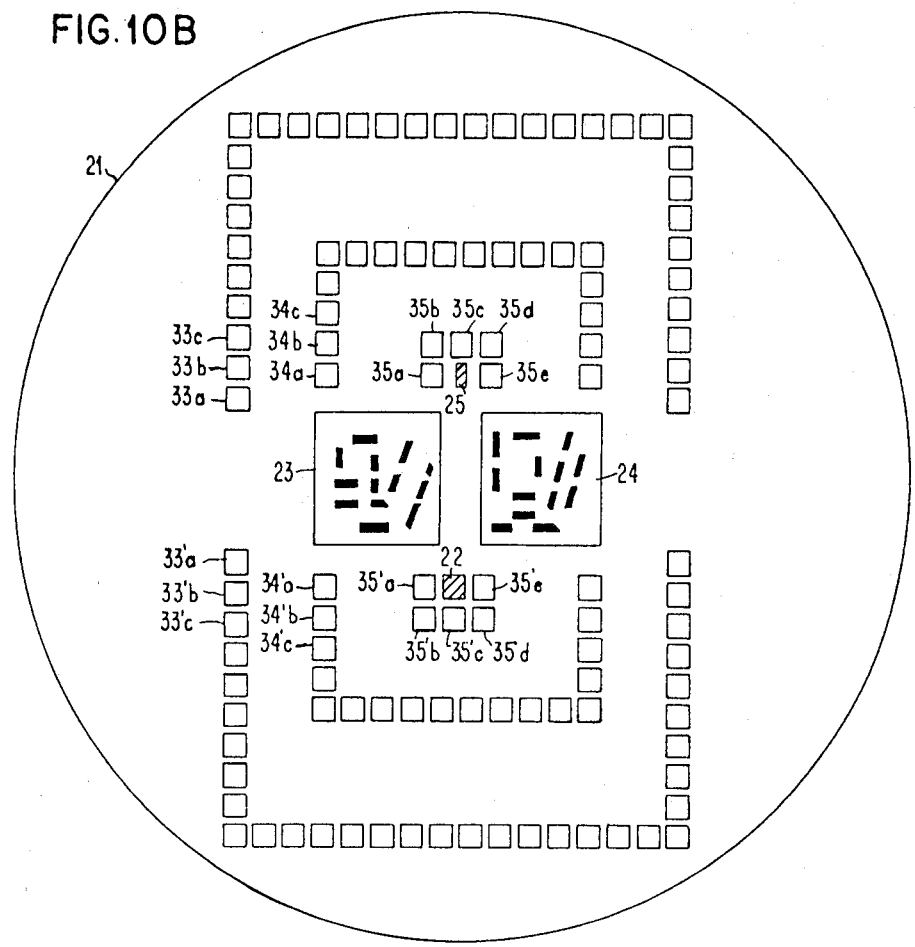
FIG. 10B is a further embodiment of an exposure mask.

FIGS. 10A and 10B show the registration and exposure grids of FIG. 2 (including the reference numbers used there) along with additional arrangements of detectors provided round the wafer and chip registration grids, respectively. In FIG. 10A, registration grids 22 and 25 are surrounded by five detectors 27a–e and 28a–e which are sensitive to reflected electrons. The semicircular arrangement of the relatively large-surface detectors has been selected in order to render the solid angle suspended by the detectors, and thus the number of detected back-scattered electrons, as large as possible.

In FIG. 10B, each of the two registration grids 22, 25 is surrounded by three U-shaped arrangements 33, 34, 35 and 33', 34', 35' of individual detectors (each marked with a, b, c . . . ). By means of such arrangements and a suitably selected electrical detector interconnection it is possible to achieve a "direction discrimination" of the reflected electrons, i.e. it is possible to find out in which direction the electrons are reflected. The form of the individual arrangements, their spacing from each other and from the registration grids, as well as the number of the respective detectors used can vary. To give an example, arrangements 33, 34 and 35 of FIG. 10B can also be designed as semicircles so that through the coincidence of the corresponding detectors it is possible to determine the direction of the reflected electrons (this detection of the direction cannot be achieved with equal precision by means of a U-shaped arrangement).

The precise determination of the reflection direction of electrons is particularly of interest for those alignment marks on the substrate which are designed as V-shaped grooves.

Two embodiments of the individual detectors in arrangements 27, 28 and 33 to 35 are depicted in FIGS.

11A and 11B. In both cases, a relatively thick silicon disk (wafer) is used as the mask 21 which comprises sloping recesses (e.g. 104 in FIG. 11A) where the registration pattern 22 is imaged as a perforation pattern in a very thin part of silicon wafer 21. For further details on structure and manufacture of such perforation patterns for electron beam lithography, reference is made to copending U.S. patent application Ser. No. 126,602 filed Mar. 3, 1980 and assigned to the assignee of the present application.

Owing to the above mentioned very small distance between mask 7 and substrate 8 in FIG. 1 there is no space left for arranging conventional particle detectors. Accordingly, the detectors have to be designed as a structural unit with mask 21. There is to be no space between the detectors and the mask surface since otherwise electrons reflected from the mask surface could reach the detectors and would thus distort the alignment signal.

FIG. 11A shows a first embodiment of such detectors connected to mask 21, where detectors 100a, b are placed as individual elements on corresponding openings 105a, 105b of the silicon disk. The openings correspond in their form to recesses 104 of the mask structure areas, and can be made in the same manufacturing process. The pn-junctions of the detectors are symbolically represented with reference numbers 102a, b, the contacts of the detectors (which can also be designed as integrated conductive paths on the mask surface) with the reference number 101a, b.

In FIG. 11A, exposure mask 21 is represented in a position which corresponds to the sectional view A, B of FIG. 10A. During registration, electron beam 2 impinges through registration grid 22 and is divided into partial beams reflected at corresponding alignment marks 106 on the surface of substrate 8. The partial beam reach detectors 100a, 100b as reflection beams 103a, 103b.

Another embodiment of the electron detectors is shown in FIG. 11B. There, the detector is designed as an integrated component of the silicon wafer of mask 21. For making the detector, silicon wafer 21 is thinned in the form of a trough down to a thin residual wafer 110, in accordance with the desired detector surface. This method corresponds to the first manufacturing step for those areas where perforation patterns are to be defined. Layer 110 is doped as a p-zone; on the surface of layer 110 an n-silicon layer 111 is applied by means of epitaxial growth. Silicon layer 111 is in turn covered by a metal electrode 112 with contact 114. The edges of the electron detector are defined by a ring insulation 113a, 113b which consists of quartz and which penetrates through the p-doped layer of silicon wafer 21.

This integrated arrangement of electron detectors can be made following the photolithography methods usual in semiconductor production so that even complicated detector arrangements, as in accordance with FIG. 10B, can be made without great difficulties. Owing to the low RC constant involved, such detector arrangements permit a short overall registration time although the signal of the reflected electrons has a higher noise factor than that of absorbed electrons.

We claim:

1. In a particle beam projection system for exposing a substrate having alignment marks comprising an exposure mask in adjacent relation and close proximity to said substrate, at least one alignment grid in said exposure mask, the alignment grid consisting of a plurality of openings arranged in matrix-fashion, the center spacings of the openings in the alignment grid increasing upon advance in two directions perpendicular to each other in such a way that no distance can be represented by the sum of smaller distances, and said alignment grid forming partial beams from a particle beam whose interaction with said alignment marks of corresponding structure on the substrate forms an alignment signal for registering the mask and the substrate.

2. A projection system as claimed in claim 1 wherein registration and exposure are effected with the same particle beam.

3. A projection system as claimed in claim 1 wherein the particle beam is an electron beam.

4. A projection system as claimed in claim 1 wherein the openings of the alignment grid are square.

5. A projection system as claimed in claim 1 wherein the openings of the alignment grid are rectangles whose long side increases in accordance with the increasing center spacing of the rectangles provided vertically thereto.

6. A projection system as claimed in claim 5 wherein the alignment grid comprises a plurality of individual grids having openings arranged in matrix-fashion.

7. A projection system as claimed in claim 1, 2, 3 or 5 wherein the exposure mask contains a first alignment grid for aligning the substrate as a whole and at least one second alignment grid for the fine alignment of individual chip patterns.

8. A projection system as claimed in claim 7 wherein the alignment grid for substrate registration has approximately the size of the particle beam and is arranged at the periphery of the exposure mask in such a manner that the registration takes place without the simultaneous exposure of the chip areas.

9. A projection system as claimed in claim 7 wherein the alignment patterns for chip registration are arranged at the periphery of the individual chip areas in such a manner that registration takes place without exposure of the chip areas.

10. A projection system as claimed in claim 9 wherein alignment marks corresponding to the alignment grids are provided on the substrate in spots through which pass kerfs for cutting the substrate into individual chips after manufacture.

11. A projection system as claimed in claim 10 wherein the alignment grid for chip registration is in the form of a rectangle whose long side corresponds to the diameter of the particle beam, and whose short side is corresponds to the width of the kerfs for substrate cutting.

12. A projection system as claimed in one of claims 1, 2, or 3, wherein the alignment signal is obtained through measuring particles of the partial beams absorbed at the alignment marks.

13. A projection system as claimed in one of claims 1, 2, or 3, wherein the alignment signal is obtained through measuring the partial beams of particles reflected from the alignment marks and particle detectors are provided in the exposure mask that respond to electrons.

14. A projection system as claimed in claim 13 wherein the alignment grid is surrounded by several particle detectors.

15. A projection system as claimed in claim 14 wherein the particle detectors are arranged in a semicircle.

16. A projection system as claimed in claim 15 wherein the particle detectors are placed on holes in the exposure mask.

17. A projection system as claimed in claim 13 wherein the exposure mask consists of a silicon wafer and the particle detectors are integrated components of the mask.

18. A projection system as claimed in claim 17 wherein the silicon wafer at the position of a particle detector is thinned out down to a thin surface layer whose conductivity differs from the rest of the silicon wafer, a surface layer of silicon of opposite conductivity is epitaxially provided, and a metal electrode is in contact with the epitaxial layer.

* * * * *